United States Patent
Wu et al.

(10) Patent No.: US 9,231,136 B2
(45) Date of Patent: Jan. 5, 2016

(54) METHOD FOR PREPARING PEROVSKITE FILM AND SOLAR CELL THEREOF

(71) Applicant: NATIONAL CENTRAL UNIVERSITY, Jhongli, Taoyuan County (TW)

(72) Inventors: Chun-Guey Wu, Hualien (TW); Chien-Hung Chiang, Tainan (TW)

(73) Assignee: National Central University, Jhongli, Taoyuan County (TW)

( * ) Notice: Subject to any disclaimer, the term of this patent is extended or adjusted under 35 U.S.C. 154(b) by 0 days.

(21) Appl. No.: 14/330,521

(22) Filed: Jul. 14, 2014

(65) Prior Publication Data
US 2015/0311364 A1    Oct. 29, 2015

(30) Foreign Application Priority Data
Apr. 29, 2014    (TW) .............................. 103115431 A (51) Int. Cl.
H01L 21/00    (2006.01)
H01L 31/032   (2006.01)
H01L 51/42    (2006.01)
H01L 31/18    (2006.01)

(52) U.S. Cl.
CPC .............. *H01L 31/032* (2013.01); *H01L 31/18* (2013.01); *H01L 51/4213* (2013.01)

(58) Field of Classification Search
CPC .... H01L 31/032; H01L 31/18; H01L 51/4213
USPC .............. 438/3, 238, 253, 386, 393, 782, 785
See application file for complete search history.

(56) References Cited

U.S. PATENT DOCUMENTS

| 6,358,811 | B1* | 3/2002 | Kim ..................... | H01L 28/56 257/E21.01 |
| 6,432,472 | B1* | 8/2002 | Farrell ................. | C04B 35/468 427/126.3 |
| 2004/0214352 | A1* | 10/2004 | Kijima ................ | C01G 33/006 438/3 |
| 2013/0222483 | A1* | 8/2013 | Kitada .................... | B41J 2/164 347/68 |
| 2013/0229464 | A1* | 9/2013 | Nawano ................ | H01L 41/318 347/68 |

FOREIGN PATENT DOCUMENTS

| CN | 103746078 A | 4/2014 |
| EP | 2693503 A1 | 2/2014 |
| TW | 200714366 | 4/2007 |
| TW | I335305 B | 1/2011 |

OTHER PUBLICATIONS

Burschka et al., "Sequential deposition as a route to high-performance perovskite-sensitized solar cells", Nature, Jul. 18, 2013, vol. 499, pp. 316-319.

* cited by examiner

*Primary Examiner* — Kevin M Picardat
(74) *Attorney, Agent, or Firm* — Muncy, Geissler, Olds & Lowe, P.C.

(57) ABSTRACT

A method for preparing a perovskite film includes the steps of applying a first solution on a substrate to form a film by spin coating and applying a second solution on the film made from the first solution by spin coating to form the perovskite film. The perovskite film is expressed by a general formula of $ABX_3$. The solute of the first solution at least contains one of AX and $BX_2$. The solute of the second solution at least contains one of AX and $BX_2$. A method for preparing the solar cell using the perovskite film as the active layer (absorber) is also disclosed.

11 Claims, 6 Drawing Sheets

FIG.2B short-circuit current density =19.98mA/cm2
open-circuit voltage =1.05V
fill factor =0.77
PCE =16.15%

METHOD FOR PREPARING PEROVSKITE FILM AND SOLAR CELL THEREOF

CROSS REFERENCE TO RELATED APPLICATIONS

This Non-provisional application claims priority under 35 U.S.C. §119(a) on Patent Application No(s). 103115431 filed in Taiwan, Republic of China on Apr. 29, 2014, the entire contents of which are hereby incorporated by reference.

BACKGROUND OF THE INVENTION

1. Field of Invention

The invention relates to the methods for preparing a perovskite thin film and a solar cell and, in particular, to the method for preparing the solar cell using the perovskite film as the active layer.

2. Related Art

Recently, with the issue of increasing energy consumption, rising oil price and global warming induced by fossil energy, searching an alternative energy without sequela becomes an important subject. The alternative energy under the spotlight nowadays encompasses hydraulic power, wind power, solar power, geothermal energy, etc. Among them, the solar cell (which converts solar energy to electricity) is one of the most attractive sources since it has several advantages such as low pollution, less environmental limitation and high safety.

Perovskite solar cell uses a perovskite film as the active layer (also called light-absorbing layer). Perovskite material has a strong absorption on the visible light and has a wide absorption range, therefore small amount of the material can produce high short-circuit current when it was applied in the solar cell. Perovskite solar cell also has a high open-circuit voltage, therefore has high power conversion efficiency (PCE).

The conventional method for preparing a high efficiency perovskite solar cell, the perovskite active layer is fabricated by an evaporation technique. However, an expensive evaporator and a high vacuum environment are required for the evaporation method and the procedure for making vacuum not only takes a lot of time and cost but also the property of the perovskite thin film is difficult to be accurately controlled.

Therefore, it is an important subject to provide a method for preparing the perovskite film and therefore the solar cell where the perovskite active layer is formed without using the evaporation technique and the property of the perovskite film can be accurately controlled and reproducible.

SUMMARY OF THE INVENTION

In view of the foregoing subject, an objective of the invention is to provide a method for preparing the perovskite thin film and the solar cell where the perovskite active layer is formed without using the evaporation technique and the property of the perovskite film can be accurately controlled.

To achieve the above objective, a method for preparing a perovskite film according to the invention includes the steps of applying a first solution on a substrate to form a film by spin coating and then applying a second solution on the film made from the first solution by spin coating to prepare the perovskite film. The perovskite film is expressed by a general formula of $ABX_3$. The solute of the first solution at least contains one of AX and $BX_2$. The solute of the second solution at least contains one of AX and $BX_2$.

To achieve the above objective, a method for preparing a solar cell using a perovskite film as an active layer comprises steps of: providing a conductive material; forming a first carrier transport layer on the conductive material; applying a first solution on the first carrier transport layer by spin coating to form a film; applying a second solution on the film made from the first solution by spin coating to form the perovskite film, which is expressed by a general formula of $ABX_3$; forming a second carrier transport layer on the perovskite film; and forming an electrode layer on the second carrier transport layer. The solute of the first solution at least contains one of AX and $BX_2$, and the solute of the second solution at least contains one of AX and $BX_2$.

In one embodiment, A represents at least one of alkali metal ions, methylamine ions, ethylamine ions, $NH_2CH=NH_2$ ions or alkylamine ions, B represents at least one of the group IV element (Ge, Sn, Pb), the group III indium (In) and the group V antimony (Sb), and X represents at least one of the elements of the group VII (F, Cl, Br, I).

In one embodiment, the solvents of the first and second solutions can be DMF or isopropanol or the mixture of the two.

In one embodiment, the conductive material is a transparent conductive glass or an opaque conductive material.

In one embodiment, the first carrier transport layer is a hole transport layer or an electron transport layer, the second carrier transport layer is an electron transport layer or a hole transport layer, and the electrode layer can be a cathode or an anode In one embodiment, the material of the hole transport layer is PEDOT:PSS (Poly(3,4-ethylenedioxythiophene) Polystyrene sulfonate), 2,2',7,7'-Tetrakis[N,N-di-(4-methoxyphenyl)amino]-9,9'-spirobifluorene (Spiro-OMeTAD), $V_2O_5$, NiO, $WO_3$ or $MoO_3$.

In one embodiment, the material of the electron transport layer is LiF, Ca, 6,6-phenyl-C61-butyric acid methyl ester ($PC_{61}BM$), 6,6-phenyl-C71-butyric acid methyl ester ($PC_{71}BM$), Indene-C60 bisadduct (ICBA), $Cs_2CO_3$, $TiO_2$, poly[(9,9-bis(3'-(N,N-dimethylamino)propyl)-2,7-fluorene)-alt-2,7-(9,9-dioctylfluorene) (PFN), Bathocuproine (BCP), ZnO, or ZrO.

In one embodiment, the material of the electrode layer is Ca, Al, Ag, Au or their any combinations.

As mentioned above, in the method for preparing the perovskite film and solar cell of the invention, the first solution and second solution are used in the two-step spin coating process to form the perovskite film ($ABX_3$), and the solute of the first solution at least contains one of AX and $BX_2$ while the solute of the second solution at least contains one of AX and $BX_2$. Thereby, the expensive evaporator is not required and the fabrication costs can be reduced. Besides, the stoichiometries of AX and $BX_2$ and the forming speed of the perovskite film can be accurately controlled by adjusting the compositions of the solution and the spin coating conditions, and thus high quality perovskite film can be fabricated and the results are reproducible.

BRIEF DESCRIPTION OF THE DRAWINGS

The invention will be more fully understood from the detailed description and accompanying drawings, which are given for illustration only, and thus are not limitative in the present invention, and wherein.

DETAILED DESCRIPTION OF THE INVENTION

The present invention will be apparent from the following detailed description, which proceeds with the reference to the accompanying drawings, wherein the same references relate to the same elements.

Perovskite is a kind of structure type in ceramic oxides which have a general formula of $ABX_3$, wherein A represents at least one of alkali metal ions, methylamine ions, ethylamine ions, $NH_2CH=NH_2$ ions, alkylamine ions and the cations with similar size, B represents at least one of the group IV element (Ge, Sn, Pb), the group III indium (In) and the group V antimony (Sb), and X represents at least one of the elements of the group VII (F, Cl, Br, I).

Figure 1:
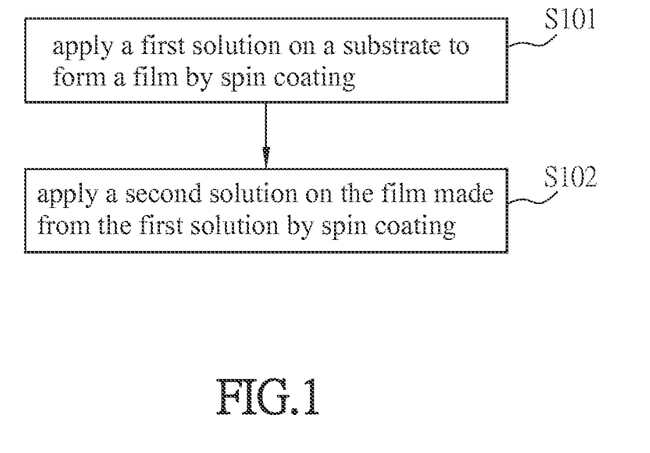
FIG. 1 is a schematic flowchart of a method for preparing a perovskite film according to an embodiment of the invention.

FIG. 1 is a schematic flowchart of a method for preparing a perovskite film according to an embodiment of the invention. As shown in FIG. 1, the step S101 is to apply a first solution on a substrate to form a film by spin coating, and then the step S102 is to apply a second solution on top of the film made from the first solution to form a perovskite film by spin coating. In one embodiment, spin coating is implemented by a spin coater. In this invention, the substrate can be transparent, flexible or not.

In this embodiment, the solute of the first solution at least contains AX or $BX_2$, and the solute of the second solution at least contains AX or $BX_2$. In detail, when the solute of the first solution at least contains AX, the solute of the second solution at least contains $BX_2$. On the contrary, when the solute of the first solution at least contains $BX_2$, the solute of the second solution contains at least AX. The solvent of the first and second solutions can be DMF (Dimethylformamide) or isopropanol and the mixture of the two for example.

As an example, if the perovskite film of $CH_3NH_3PbI_3$ is prepared, the solute of the first solution can be $PbI_2$, the solvent thereof can be DMF and the favorable weight percent concentration is 20 wt %. Besides, the solute of the second solution can be $CH_3NH_3I$ while the solvent can be isopropanol, and the favorable weight percent concentration is 2 wt %. In an actual application, the contents of the first and second solutions can interchange with each other.

Accordingly, the $ABX_3$ thin film of this embodiment is prepared by a two-step spin coating process where the first solution and the second solution (also called precursor solution) are separately prepared and the films was made from the solution by spin coating. The solute of the first solution at least contains one of AX and $BX_2$ while the solute of the second solution at least contains one of AX and $BX_2$. Thereby, the $ABX_3$ thin film of this embodiment can be formed without using the evaporation technique, and therefore the expensive evaporator is not required and the time for creating a vacuum can be saved In other embodiments, the $ABX_3$ film is formed by one-step process where AX solution and $BX_2$ solution are mixed together first to form a perovskite solution and then the perovskite solution is applied on the substrate to form a film by spin coating. However, the one-step process can't accurately control the stoichiometry of AX and $BX_2$ and the rate of forming the perovskite film at the same time, resulting in the bad quality $ABX_3$ film. By contrast, the two-step process of this embodiment can separately adjust the property of the first and second solutions and film formation condition (such as composition, concentration, spin speed and time or fabrication temperature), to accurately control the quality of the prepared perovskite film.

Figure 2A:
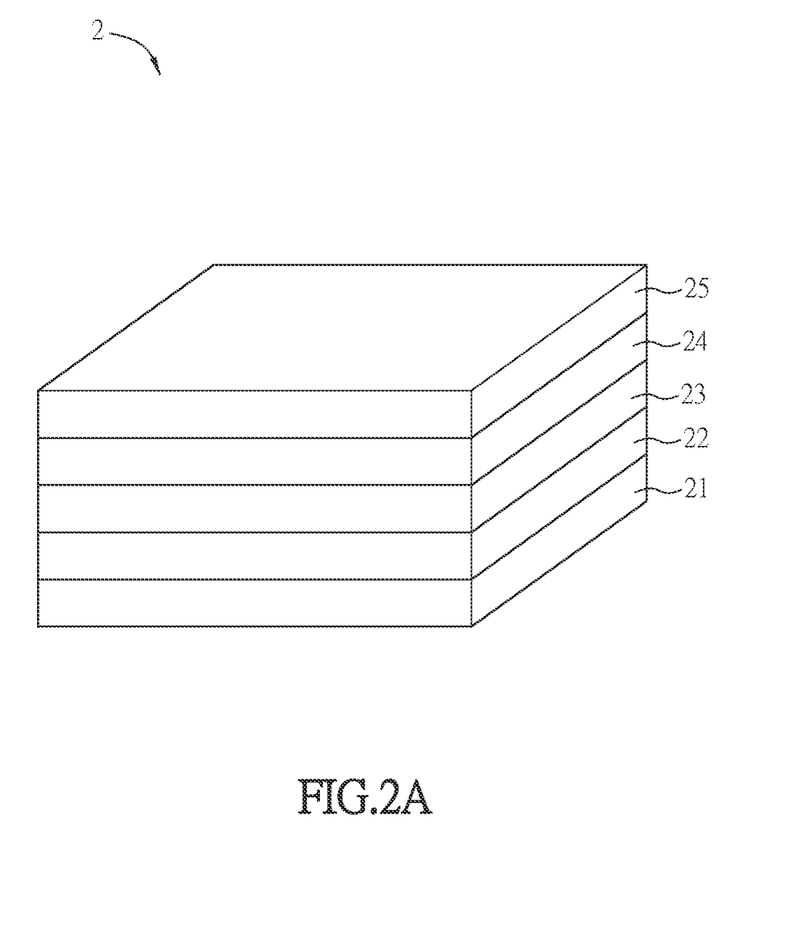
FIG. 2A is a schematic diagram of the solar cell architecture using perovskite film as the active layer according to an embodiment of the invention.
Figure 2B:
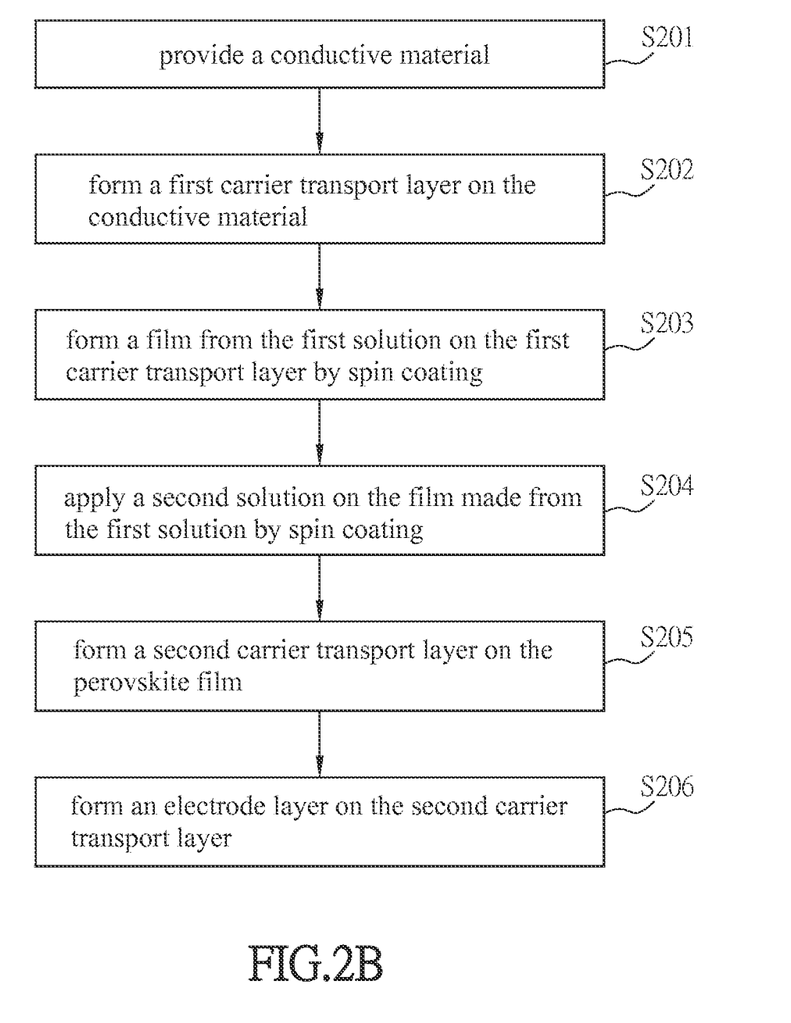
FIG. 2B is a schematic flowchart of a method for preparing the solar cell using perovskite film as the active layer according to an embodiment of the invention.

FIG. 2A is a schematic diagram of the structure of the solar cell using the perovskite film as the active layer according to an embodiment of the invention, and FIG. 2B is a schematic flowchart of a method for preparing the solar cell using the perovskite film as the active layer according to an embodiment of the invention.

As shown in FIG. 2A, the solar cell 2 of this embodiment uses the perovskite film made by the previous preparing method as the active layer 23. Actually, when the sunlight is emitted to the solar cell 2 and absorbed by the active layer 23 (also called light-absorbing layer), the electron-hole pairs will be generated inside the solar cell 2, and the quantity, moving speed and binding energy of the electron-hole pairs are the key factors for determining the output current of the solar cell. Therefore, the material property or quality of the active layer 23 will seriously affect the power conversion efficiency (PCE) of the solar cell.

As shown in FIGS. 2A and 2B, the following embodiment will be illustrated by taking the solar cell 2 as a regular structure, but this invention is not limited thereto. First, the step S201 is to provide a conductive material 21, which can be a transparent or opaque material and a transparent conductive glass is favorable, such as ITO (indium doped tin Oxide) glass, FTO (fluorine doped tin oxide) glass or other transparent conductive material.

Then, the step S202 is to form a first carrier transport layer 22 on the conductive material 21 by spin coating or other techniques. Since the solar cell of this embodiment is a regular structure, the first carrier transport layer 22 is a hole transport layer with the material such as PEDOT:PSS or other materials suitable for the hole transport. The step S203 is to form a film from the first solution on the first carrier transport layer 22 by spin coating. In this embodiment, the solute of the first solution is $PbI_2$, the solvent thereof is DMF, the weight percent concentration is 20 wt %, and the film is formed by the spin coating rate of 3000 RPM (Revolutions Per Minute) for 30 seconds. Then, the step S204 is to form a perovskite thin film of $CH_3NH_3PbI_3$ by applying the second solution to top of $PbI_2$ film by spin coating. In this embodiment, the solute of the second solution is $CH_3NH_3I$, the solvent thereof is isopropanol, the weight percent concentration is 2 wt %, and the spin coating rate is 1500 RPM for 50 seconds. The formed perovskite film serves as the active layer 23 of the solar cell 2 of this embodiment.

Then, the step S205 is to form a second carrier transport layer 24 on the perovskite film (active layer 23) by vacuum evaporation, spin coating or other techniques. Since the solar cell of this embodiment is a regular structure, the second carrier transport layer 24 is an electron transport layer with the material such as LiF, Ca, 6,6-phenyl-C61-butyric acid methyl ester ($PC_{61}BM$), 6,6-phenyl-C71-butyric acid methyl ester ($PC_{71}BM$), Indene-C60 bisadduct (ICBM, poly[(9,9-bis(3'-(N,N-dimethylamino)propyl)-2,7-fluorene)-alt-2,7-(9,9-dioctyl-fluorene) (PFN), Bathocuproine (BCP), ZnO, ZrO or other materials suitable for the electron transport.

The step S206 is to form an electrode layer 25 on the second carrier transport layer 24 by evaporation or other techniques. Since the solar cell of this embodiment is a regular structure, the electrode layer 25 can be Ca, Al, Ag, Au or their any combinations.

In other embodiments, the solar cell 2 also can be an inverted structure. When the solar cell 2 is an inverted structure, the first carrier transport 22 is an electron transport layer with the material such as $Cs_2CO_3$, $TiO_2$, ZnO, poly[(9,9-bis(3'-(N,N-dimethylamino)propyl)-2,7-fluorene)-alt-2,7-(9,9-dioctyl-fluorene) (PFN), ZrO or other materials suitable for the electron transport. Besides, the second carrier transport layer 24 is a hole transport layer with the material such as $V_2O_5$, 2,2',7,7'-Tetrakis[N,N-di(4-methoxyphenyl)amino]-9,9'-spirobifluorene (Spiro-OMeTAD), NiO, $WO_3$, $MoO_3$ or other materials suitable for the hole transport. Then, the electrode layer 25 can be Ag or Au.

Figure 3:
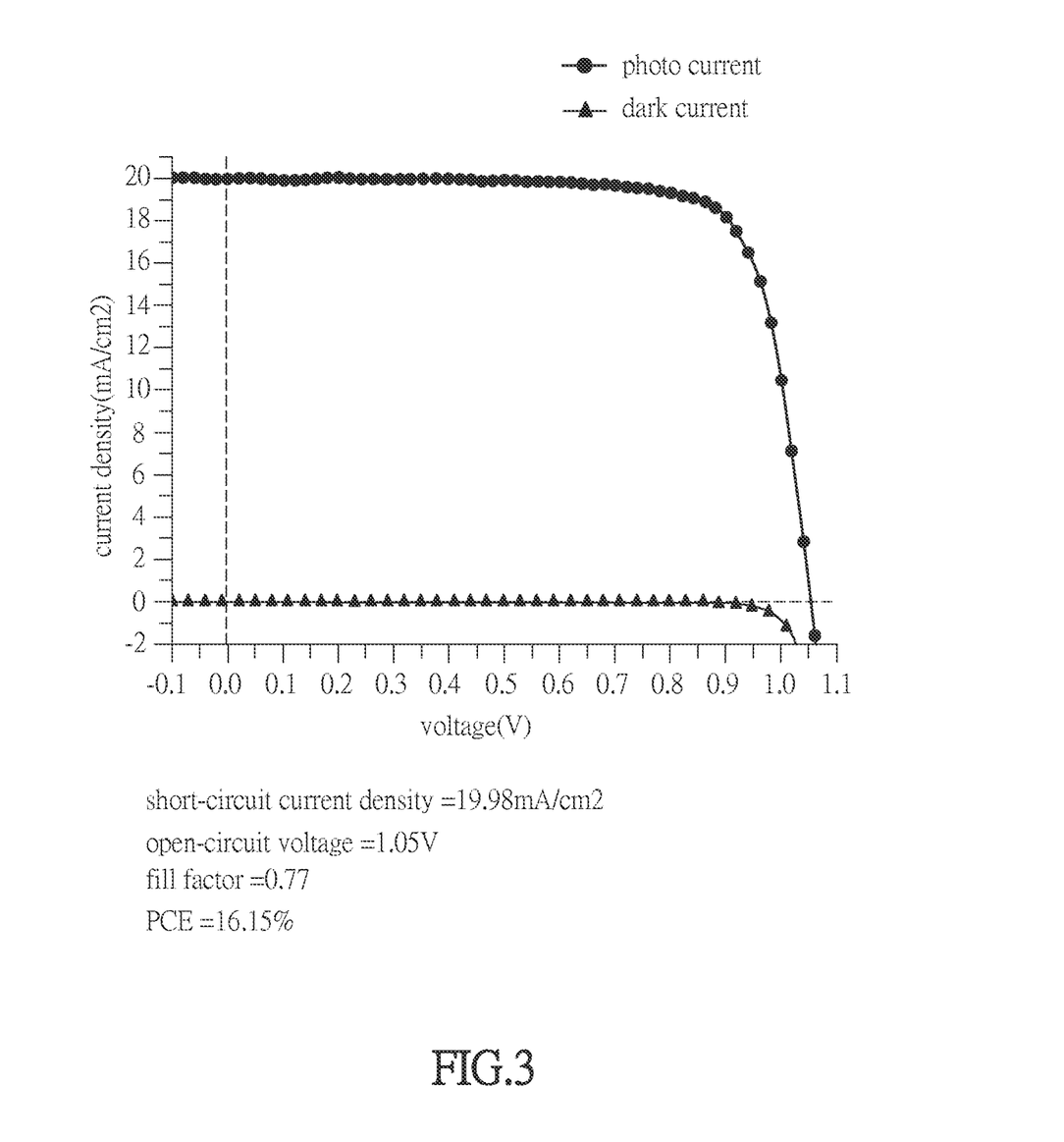
FIG. 3 is a schematic diagram of the current-voltage curve of the perovskite solar cell according to a first embodiment of the invention.

FIG. 3 is a schematic diagram of the current-voltage curve of the perovskite solar cell according to a first embodiment of the invention. By referring to FIG. 2A also, in this embodiment, the conductive material 21 is ITO substrate, and the first carrier transport layer 22 is PEDOT:PSS formed on the ITO substrate. Then, the first solution (20 wt % $PbI_2$/DMF solution) is applied on ITO/PEDOT:PSS to form a $PbI_2$ film by spin coating with the spin speed of 3000 RPM for 30 seconds. Then, the baking is implemented for 30 seconds at 100° C., and the second solution (2 wt % $CH_3NH_3I$/isopropanol solution) is applied on the ITO/PEDOT:PSS/$PbI_2$ to make perovskite film by the spin coating with the spin speed of 1500 RPM for 50 seconds. Subsequently, the ITO/PEDOT:PSS/Perovskite film is dried for 20 minutes. The perovskite film is just the active layer 23. Then, the $PC_{71}BM$ (the second carrier transport layer 24) is formed on the ITO/PEDOT:PSS/Perovskite film by spin coating from the corresponding solution. Lastly, the aluminum metal (the electrode layer 25) is formed by evaporation and then the perovskite solar cell with the efficiency of 3.31% can be obtained. Moreover, using the same method but giving the optimum spin speed, concentration of $CH_3NH_3I$, and material of the electron transport layer and electrode layer, the perovskite solar cell can achieve the short-circuit current density of 19.98 $mA/cm^2$, the open-circuit voltage of 1.05V, the fill factor of 0.77 and the power conversion efficiency (PCE) of 16.15%, with the current-voltage curve shown in FIG. 3.

Figure 4:
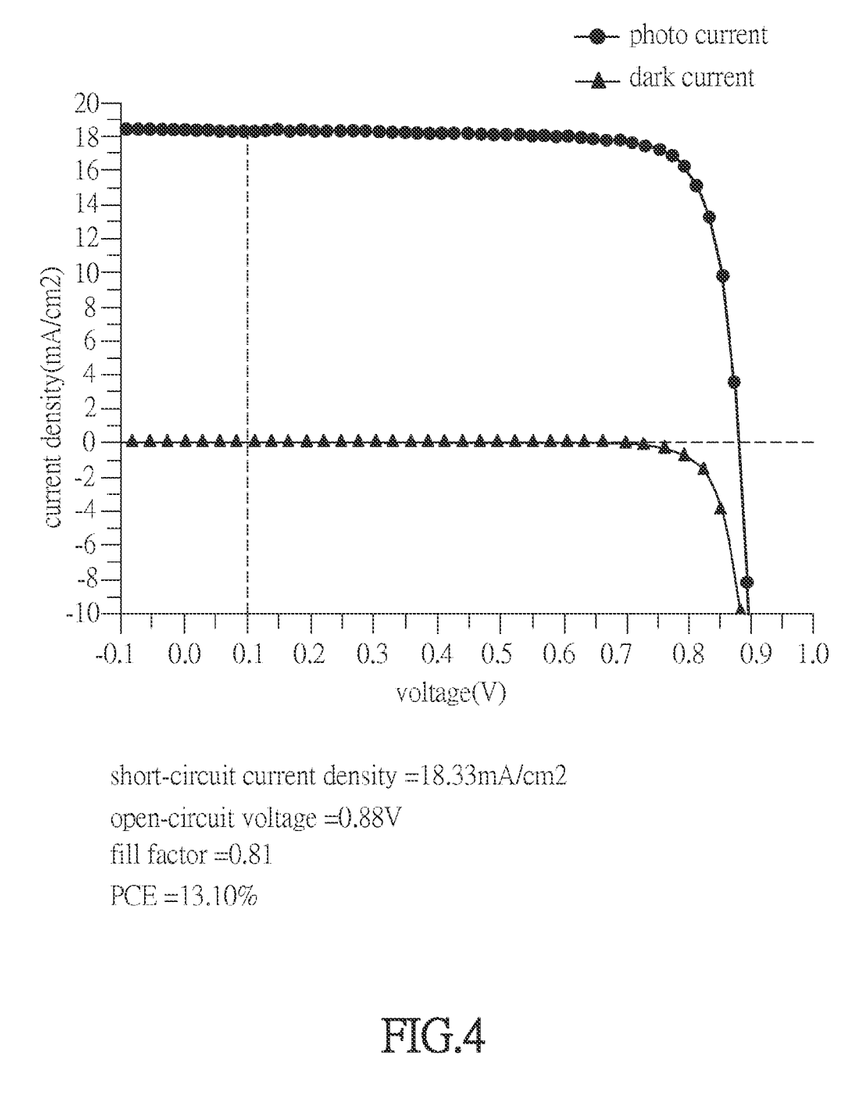
FIG. 4 is a schematic diagram of the current-voltage curve of the perovskite solar cell according to a second embodiment of the invention.

FIG. 4 is a schematic diagram of the current-voltage curve of the perovskite solar cell according to a second embodiment of the invention. By referring to FIG. 2A also, in this embodiment, the conductive material 21 is also ITO substrate, and the first carrier transport layer 22 is also PEDOT:PSS formed on ITO substrate. Then, the first solution (mixed solution of 0.5M $PbI_2$ and $PC_{61}BM$) is applied on ITO/PEDOT:PSS to form a film by spin coating with the spin speed of 3000 RPM for 60 seconds. Then, the baking is implemented for 30 seconds at 100° C., and the second solution (2 wt % $CH_3NH_3I$/isopropanol solution) is applied thereon to form a bulk heterojunction perovskite/$PC_{61}BM$ film by the spin coating with the spin speed of 1500 RPM for 50 seconds. Subsequently, the ITO/PEDOT:PSS/Perovskite-$PC_{61}BM$ film was dried for 20 minutes. The perovskite/$PC_{61}BM$ film is just the active layer 23 as well as the second carrier transport layer 24. Lastly, the aluminum metal (the electrode layer 25) is applied by evaporation and then the perovskite solar cell with the efficiency of 4% can be obtained. Moreover, by the same method but giving the optimum spin speed, concentration of $CH_3NH_3I$ and material of electron transport layer and electrode layer, the perovskite solar cell achieves the short-circuit current density of 18.33 $mA/cm^2$, the open-circuit voltage of 0.88 V, the fill factor of 0.81 and the power conversion efficiency (PCE) of 13.10%, and the corresponding current-voltage curve is shown in FIG. 4.

Figure 5:
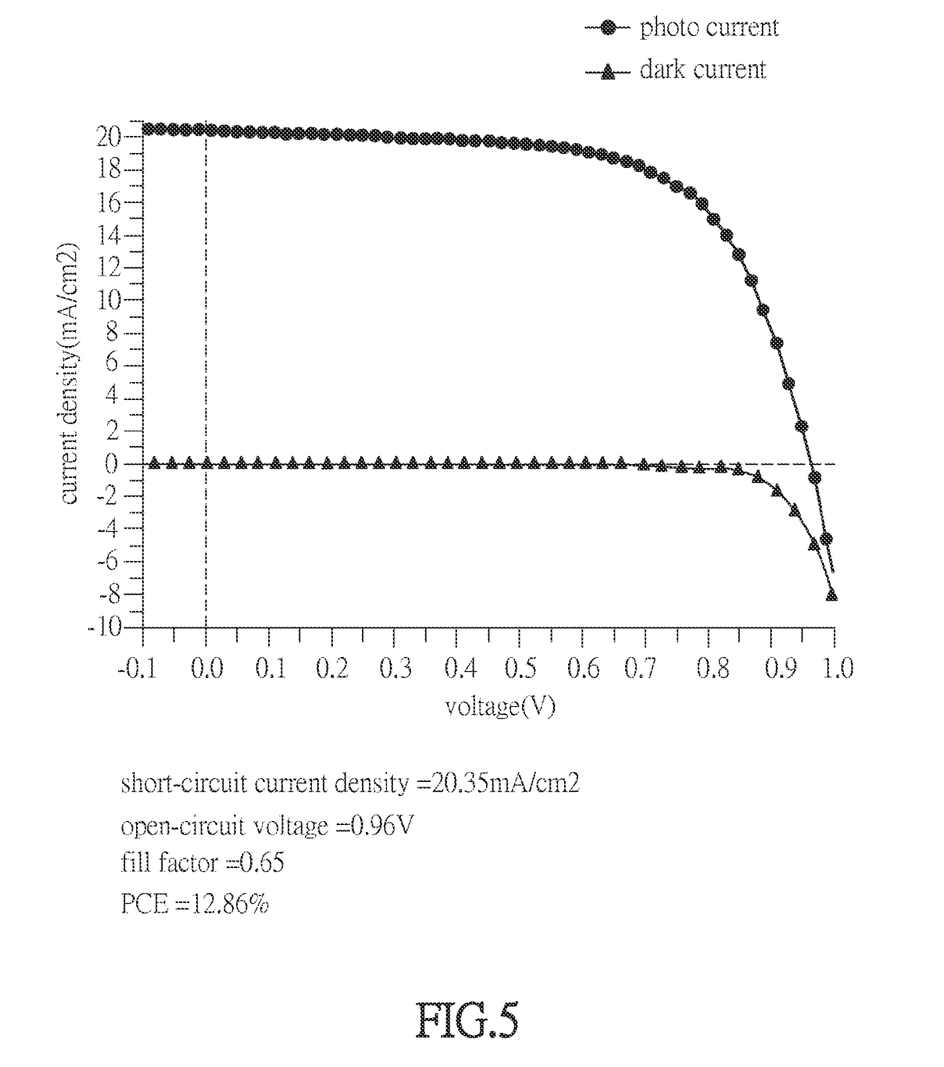
FIG. 5 is a schematic diagram of the current-voltage curve of the perovskite solar cell according to a third embodiment of the invention.

FIG. 5 is a schematic diagram of the current-voltage curve of the perovskite solar cell according to a third embodiment of the invention. By referring to FIG. 2A also, in this embodiment, the conductive material 21 is also ITO substrate, and the first carrier transport layer 22 is also PEDOT:PSS formed on the ITO substrate. Then, the first solution (20 wt % $PbI_2$/DMF solution) is applied on ITO/PEDOT:PSS to form a $PbI_2$ film by spin coating with the spin speed of 3000 RPM for 30 seconds. Then, the baking is implemented for 30 seconds at 100° C., and 2 wt % $CH_3NH_3Cl$/isopropanol solution, $CH_3NH_3Br$/isopropanol solution and $CH_3NH_3I$/isopropanol solution (the order can be exchanged) are applied on the ITO/PEDOT:PSS/$PbI_2$ to form perovskite film by spin coating with the spin speed of 1500 RPM for 50 seconds. Subsequently, the ITO/PEDOT:PSS/$CH_3NH_3Cl_xBr_yI_z$ film was dried for 20 minutes. The $CH_3NH_3Cl_xBr_yI_z$ film is just the active layer 23. Then, the $PC_{61}BM$ (the second carrier transport layer 24) is formed thereon by spin coating. Lastly, the aluminum metal (the electrode layer 25) is formed by evaporation and then the perovskite soar cell with the efficiency of 4% was obtained. Moreover, by the same method but giving the optimum spin speed, concentration of $CH_3NH_3X$ (X is Cl, Br or I), and material of electron transport layer and electrode layer, the perovskite solar cell achieves the short-circuit current density of 20.35 $mA/cm^2$, the open-circuit voltage of 0.96 V, the fill factor of 0.65 and the power conversion efficiency (PCE) of 12.86%, with the current-voltage curve as shown in FIG. 5.

In this embodiment, the perovskite thin film formed by the two-step spin coating is used as the active layer of the perovskite solar cell, and the parameters of the first solution, second solution and spin coating process are adjusted to accurately control the properties of perovskite film such as the film thickness or surface roughness. Thereby, the perovskite film in the perovskite solar cell is suitable to be the active layer, and the PCE of the perovskite solar cell can be increased due to the enhanced quality of the perovskite film.

By referring to the following table, in comparison with the conventional perovskite solar cell, the PCE is raised to 16.15% from 11.5% and the fill factor is raised to 0.77 from 0.74, for the solar cell using the perovskite film as the active layer prepared with the method disclosed in this invention. The ideal value of the fill factor is 1, and when the fill factor of the solar cell more approaches 1, the output characteristic of the solar cell is more close to ideal.

| perovskite solar cell | PCE (%) | fill factor (FF) |
| --- | --- | --- |
| conventional | 11.5 | 0.74 |
| the invention | 16.15% | 0.77 |

Summarily, in the method for preparing the perovskite film and solar cell of the invention, the perovskite ($ABX_3$) film was formed by the two-step spin coating from the first solution and the second solution, and the solute of the first solution at least contains one of AX and $BX_2$ while the solute of the second solution at least contains one of AX and $BX_2$. Thereby, the expensive evaporator is not required and the film fabrication time can be shortened. Besides, the stoichiometry of AX and $BX_2$ and the forming speed of the perovskite film can be accurately controlled by adjusting the parameters of the solutions and the spin coating process, and thus the formation of the perovskite film can be controlled so that the perovskite thin film with better quality can be produced. Therefore, the PCE of the perovskite solar cell using the perovskite film as the active layer can be increased.

Although the invention has been described with reference to the specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A method for preparing a perovskite film, comprising steps of:
    applying a first solution on a substrate to form a film by spin coating; and
    applying a second solution on the film made from the first solution to form the perovskite film, which is expressed by a general formula of $ABX_3$ by spin coating,
    wherein the solute of the first solution at least contains one of AX and $BX_2$, and the solute of the second solution at least contains one of AX and $BX_2$.

2. The method for preparing a perovskite film as recited in claim 1, wherein A represents at least one of alkali metal ions, methylamine ions, ethylamine ions, $NH_2CH=NH_2$ ions or alkylamine ions, B represents at least one of the group IV element (Ge, Sn, Pb), the group III indium (In) and the group V antimony (Sb), and X represents at least one of the elements of the group VII (F, Cl, Br, I).

3. The method for preparing a perovskite film as recited in claim 1, wherein each of the solvents of the first and second solutions is DMF or isopropanol or the mixture of the two.

4. A method for preparing a solar cell using a perovskite film as an active layer, comprising steps of:
    providing a conductive material;
    forming a first carrier transport layer on the conductive material;
    applying a first solution on the first carrier transport layer to form a film by spin coating;
    applying a second solution on the film made from the first solution to form the perovskite film, which is expressed by a general formula of $ABX_3$ by spin coating;
    forming a second carrier transport layer on the perovskite film; and
    forming an electrode layer on the second carrier transport layer,
    wherein the solute of the first solution at least contains one of AX and $BX_2$, and the solute of the second solution at least contains one of AX and $BX_2$.

5. The method for preparing a solar cell as recited in claim 4, wherein A represents at least one of alkali metal ions, methylamine ions, ethylamine ions, $NH_2CH=NH_2$ ions or alkylamine ions, B represents at least one of the group IV element (Ge, Sn, Pb), the group III indium (In) and the group V antimony (Sb), and X represents at least one of the elements of the group VII (F, Cl, Br, I).

6. The method for preparing a solar cell as recited in claim 4, wherein each of the solvents of the first and second solutions is DMF or isopropanol or the mixture of the two.

7. The method for preparing a solar cell as recited in claim 4, wherein the conductive material is a transparent conductive glass or an opaque conductive material.

8. The method for preparing a solar cell as recited in claim 4, wherein the first carrier transport layer is a hole transport layer or an electron transport layer, the second carrier transport layer is an electron transport layer or a hole transport layer, and the electrode layer is a cathode layer or an anode layer.

9. The method for preparing a solar cell as recited in claim 8, wherein the material of the hole transport layer is PEDOT:PSS (Poly(3,4-ethylenedioxythiophene) Polystyrene sulfonate), 2,2',7,7'-Tetrakis[N,N-di(4-methoxyphenyl)amino]-9,9'-spirobifluorene (Spiro-OMeTAD), $V_2O_5$, NiO, $WO_3$ or $MoO_3$.

10. The method for preparing a solar cell as recited in claim 8, wherein the material of the electron transport layer is LiF, Ca, 6,6-phenyl-C61-butyric acid methyl ester ($PC_{61}BM$), 6,6-phenyl-C71-butyric acid methyl ester ($PC_{71}BM$), Indene-C60 bisadduct (ICBA), $Cs_2CO_3$, $TiO_2$, poly[(9,9-bis(3'-(N,N-dimethylamino)propyl)-2,7-fluorene)-alt-2,7-(9,9-dioctylfluorene) (PFN), Bathocuproine (BCP), ZnO, ZrO.

11. The method for preparing a solar cell as recited in claim 8, wherein the material of the electrode layer is Ca, Al, Ag, Au or their any combination.

* * * * *